US007007378B2

(12) United States Patent
Gaudiello et al.

(10) Patent No.: US 7,007,378 B2
(45) Date of Patent: Mar. 7, 2006

(54) PROCESS FOR MANUFACTURING A PRINTED WIRING BOARD

(75) Inventors: John G. Gaudiello, Poughkeepsie, NY (US); James D. Herard, Vestal, NY (US); John J. Konrad, Endicott, NY (US); Jeffrey McKeveny, Endicott, NY (US); Timothy L. Wells, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 10/317,329

(22) Filed: Dec. 12, 2002

(65) Prior Publication Data

US 2003/0102160 A1 Jun. 5, 2003

Related U.S. Application Data

(63) Continuation-in-part of application No. 09/344,322, filed on Jun. 24, 1999, now abandoned.

(51) Int. Cl.
*H01R 9/00* (2006.01)

(52) U.S. Cl. ............................ 29/842; 29/825; 29/846; 205/118; 228/179.1; 228/180.21

(58) Field of Classification Search .................. 29/825, 29/842, 843, 846; 205/118; 228/179.1, 228/180.21
See application file for complete search history.

(56) References Cited

U.S. PATENT DOCUMENTS

| | | | | |
|---|---|---|---|---|
| 5,066,550 | A | 11/1991 | Horibe et al. | |
| 5,356,526 | A | 10/1994 | Franenthal et al. | |
| 5,549,808 | A | 8/1996 | Farooq et al. | |
| 6,083,375 | A * | 7/2000 | Cheng et al. | 205/118 |
| 6,669,077 | B1 * | 12/2003 | Kawashima et al. | 228/180.21 |
| 6,809,414 | B1 * | 10/2004 | Lin et al. | 257/692 |

* cited by examiner

*Primary Examiner*—Carl J. Arbes
(74) *Attorney, Agent, or Firm*—Mark Levy & Associates, PLLC

(57) ABSTRACT

A process for manufacturing a land grid array connector for a printed wiring board is disclosed. The process does not require electroplating precious metal overlays. Therefore, no commoning bar is required. Another benefit of the invention includes a connector design using only a flash, soft gold application in the outer surface of the connector. Physical hardness and durability are derived from a thin palladium layer lying beneath the flash gold layer.

5 Claims, 1 Drawing Sheet

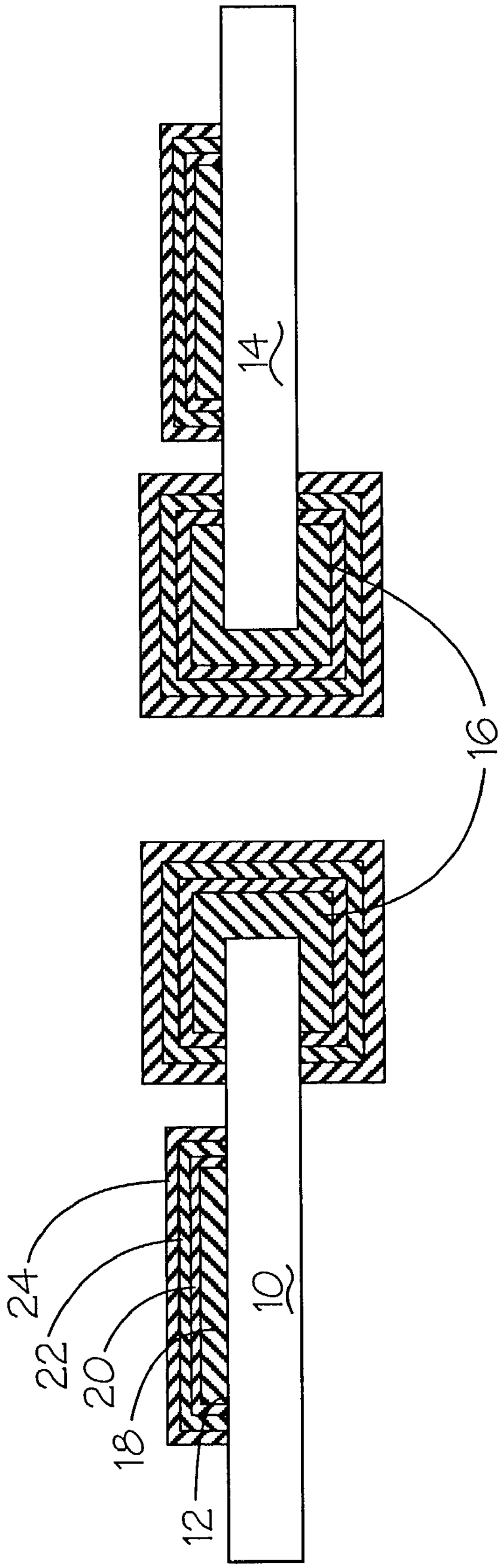
*The Figure*

PROCESS FOR MANUFACTURING A PRINTED WIRING BOARD

RELATED PATENT APPLICATION

The present patent application is a continuation in-part to U.S. patent application Ser. No. 09/344,322, filed on Jun. 24, 1999, now abandoned.

FIELD OF THE INVENTION

This invention relates to a high performance electronic connector, such as a land grid array, having very high density per unit of area, and to a method of fabrication and utilization of such a connector to achieve improved performance, quality, and reliability compared to prior arrangements.

BACKGROUND OF THE INVENTION

Electronic circuits and, more particularly, the more complex circuits found in computer logic systems, frequently employ one or more printed circuit or wiring boards on which various components or elements are mounted. To electronically interconnect these components to printed circuit boards for feeding electrical power and signals to the circuit elements, various connector arrangements are utilized. Examples of components of the external system are integrated circuit chips, adapter cards, and insulating packages that typically have leads in the form of pads on the surface or other contacts extending therefrom in rows to form planar disposed arrays which are then matched with conductive pads or features on the printed wiring boards. Interconnection between the conductive pads or leads of a component to the conductive pads, connective features, or traces of a circuit board is accomplished in a number of ways, including soldering. In instances in which the removal and replacement of components is necessary during the life of a system, other suitable electrical connectors can be used. In the latter case, electrical connection between printed circuit boards and external systems can be provided by gold contacts, as edge tabs, chip tabs, and lands.

The gold contacts atop lands and tabs are typically provided by electrodeposition. Electrodeposition of gold has been the preferred method for plating gold, since deposited gold has improved hardness compared to electroless plated gold. This hardness is desirable in order to provide contact sites with high durability, especially where components might be replaced multiple times. However, a major disadvantage with electrolytic gold plating is the need for commoning bars to provide electrical connections to the features to be plated. These commoning bars require fairly large footprints on the printed wiring board, ultimately wasting valuable space that could otherwise be used for placement of additional circuitry or other features. In the field of fine line circuitry, such space is simply unavailable.

Since printed circuits are normally formed on boards or laminate sheets made of various epoxy compositions or fiberglass and relatively thin layers of copper which have been etched or deposited to define the desired circuit, the problem in each case is one of coupling from the relatively thin circuit conductor leads which are "printed" on the board to either a solder site or a mechanical connector which is generally three-dimensional.

As previously mentioned, numerous types and varieties of modern equipment and devices require sophisticated interconnection of electronic components. With the recent strong trend toward reduced sizes in electronic components and the resulting high density of conductive interconnection surfaces on such equipment, there have been increased demands on the performance of contacts used to provide such interconnections.

In the past decade, the density per unit area of electronic devices, such as very large scale integrated circuits (VLSIs), has greatly increased. By some estimates, this increase in density has been 10,000 times greater than what it was in the earliest days of the technology. The space or area available outside of a VLSI in which to make the large number of necessary connections to and from it is becoming almost immeasurable compared to previous standards. Contrary to the density increase of VLSIs, the density of the passive circuit interconnections, such as connectors, has increased (i.e., the parts have decreased in size) by the relatively small factor of approximately 4 to 1. This presents the difficult problem of providing connections to and from the VLSIs that are both small enough to fit the spaces available and sufficiently reliable and manufacturable to be economically useful.

As interconnections are made smaller and smaller, the problems associated with manufacturing and assembling these miniature parts seem to grow exponentially. A conventional pin and socket connector part, e.g., a 25 square metal wire-wrap post, has sufficient size and strength to be easily made and handled with conventional techniques. Typically, parts of such "large" size are assembled into connector systems having "large" centers, such as one-tenth by one-tenth inch; however, connectors this large are unwieldy and outdated in the environment of the VLSIs of today.

It is more difficult to achieve a "safe" minimum contact when the individual contacts of a connector are made smaller and smaller to achieve higher density. The miniature parts such as pins and sockets do not have as much mechanical strength as larger parts, and strength usually decreases exponentially rather than linearly as size decreases. Thus, all factors of size, strength, contact force, uniformity, and stability must be dealt with when designing a high density electronic connector where reliable performance is essential.

It is also highly desirable that the contact resistance remains stable at a very low value like a few milliohms throughout the service life of the connector. The contact resistance of mating parts in an electrical connector is extensively discussed in the literature (see, for example, *Electrical Contacts* by Ragnar Holm, published by Springer-Verlag). An important factor in the stability of the contact resistance is the character or quality of the interface or mating surfaces of the contacts. These surfaces should be free of contaminants, substantially immune to oxidation or corrosion, and held together with minimum force sufficient to ensure intimate metal-to-metal contact.

These considerations, especially where high quality electronic connectors are involved, lead to the use of gold (or a similar noble metal) in the contact areas and to contact designs providing normal contact forces for each pair of contacts in the range from approximately 100 gms to 150 gms (about 4 oz.). The mating forces of the halves of the connector can easily reach a hundred or more pounds, when hundreds of pairs of contacts of a single connector are involved. Thus, it is highly desirable for a high density connector to minimize the mating or insertion force, while maintaining normal contact forces (approximately 100 grams).

It is desirable to provide a high density electronic connector system that provides very low, stable contact resistance together with thermal and mechanical stability (durability), as well as low mating force. It is also desirable to provide an economical and effective method of manufacturing and assembling such a connector system with the precision and uniformity required.

U.S. Pat. No. 5,066,550, issued to Horibe et al. on Nov. 19, 1991 for ELECTRIC CONTACT, discloses an electric contact having a copper-based layer with a nickel-based layer coated thereon, followed by a palladium-based layer coated on the nickel layer and a gold layer coated on top of the palladium layer. The nickel-based layer as disclosed requires the presence of non-crystalline nickel, which may be alone or in contact with a second layer of nickel in crystalline form. The thickness of the nickel layer or layers is reported to be in the range of 0.8–2.0 microns. As a comparative example, Horibe et al. teach that if an exclusively crystalline nickel layer of a 1.0 micron thickness is used, whether in the presence or absence of a gold top coat layer, the resistance over a period of 24 hours grows unacceptably large. Furthermore, Horibe et al. teach the use of electroplated gold. Therefore, Horibe et al. miss the benefit of the current invention, viz., that commoning wiring can be avoided for the manufacture of gold plated interconnects. Horibe et al. also do not describe or teach that, although a crystalline nickel layer at 1–2 micron failed in their system, thicker layers of nickel will provide beneficial properties, as disclosed in the present invention.

U.S. Pat. No. 5,356,526, issued to Frankenthal et al. on Oct. 18, 1994 for COPPER-BASED METALLIZATIONS FOR HYBRID INTEGRATED CIRCUITS, describes a new metallization for interconnects that is a composite of subsequent metal layers beginning with a layer of titanium and having in ascending order the following composition: Ti—TiPd—Cu—Ni—Au. No reference is made to changing the order of the metal layers to have palladium (Pd) or titanium/palladium (TiPd) in the layer between the nickel (Ni) layer and the gold (Au) layer. Without this specific juxtaposition (Ni—Pd—Au), the current invention would be inoperative.

In U.S. Pat. No. 5,549,808, issued to Farooq et al. on Aug. 27, 1996 for METHOD FOR FORMING CAPPED COPPER ELECTRICAL INTERCONNECTS, a novel composition of capped copper that is useful for electrical interconnects is disclosed. An integrated circuit material is disclosed, not a printed wiring board, as in the present invention. The capping of copper is shown to have up to three capping layers. Each capping layer contains copper, aluminum, gold, or nickel. No mention is made of the benefit of using palladium as the penultimate layer underneath the ultimate gold layer. Furthermore, the '808 patent teaches the use of electroplating to apply the noble metal layers. This process requires the use of a commoning wire, which is specifically excluded in the present invention.

In a co-pending U.S. patent application, Ser. No. 08/873,060 entitled "Universal Surface Finish For DCA, SMT and Pad on Pad Interconnections," filed Jun. 11, 1997, to the same assignee of the present invention, a multilayered interconnect of similar coating hierarchy is described, viz. Cu—Ni—Pd—Au. In this co-pending patent application, layer thicknesses are disclosed. For the two precious metal layers, the disclosed thicknesses are significantly higher than those of the present invention. Besides the obvious cost benefit derived from reducing layer thickness, there is the less obvious benefit of exploiting the hardness of the palladium layer (260 to 300 Knoop), allowing soft gold (60 to 90 Knoop) to be used as the final top layer. Additionally, palladium, even as a thin coated layer, significantly assists in promoting adhesion to the nickel diffusion or metal barrier layer. With the thicker layers described in the co-pending application, this benefit is lost.

SUMMARY OF THE INVENTION

Having described the current state of the art and associated problems that remain, it is an object of the present invention to provide a printed wiring board that has high density circuitry and features.

It is another object of the present invention to provide a method of forming a high density printed wiring board that may be single or double sided with circuitry and features, and furthermore, may be multilayered and have embedded circuitry.

It is still another object of the present invention to provide a method of forming a printed wiring board utilizing only electroless plating or immersion plating of noble metals, thereby eliminating the need for a commoning bar.

It is yet another object of the present invention to provide a high density printed wiring board with land grid arrays having precious metal conformally plated features.

It is another object of the invention to provide a printed wiring board with land grid arrays having contact sites that are of high durability.

To meet the stated objectives, the present invention comprises a process involving a unique series of steps and materials utilizing a printed wiring board manufacturing intermediate wherein circuitry is protected by a photoresist, and potential connector sites, e.g., land grid arrays, are uncovered to allow modification of the copper features therein.

The inventive process begins with plating the exposed copper features with a passivating layer. The passivating layer is then overplated with a first precious metal layer. Finally, the first precious metal is overplated with a second precious metal. All plating steps are performed without the aid of a commoning bar. The precious metal protective layers provide a chemically inert, highly conductive, and physically durable connective site.

In one preferred embodiment of the invention, the physical hardness for the connective site is derived from the first precious metal (palladium) plated layer, and the chemical inertness is derived from the second precious metal (soft gold) plating. The multilayered interconnects have a coating hierarchy, viz. Cu—Ni—Pd—Au, which has the physical hardness of Ni (230 Knoop), followed by palladium (260 to 300 Knoop), and soft gold (60 to 90 Knoop). It should be observed that the hard gold normally provided by other methods of deposition is not needed here by virtue of the hardness of the palladium.

BRIEF DESCRIPTION OF DRAWING

The present invention will become more fully understood from the detailed description and the accompanying drawing, wherein the sole FIG. is a sectional view of a connector having layers according to the invention.

DETAILED DESCRIPTION OF THE PREFERRED EMBODIMENT

The present invention provides a printed wiring board that has incorporated as part of its features a connection site or multiple connection sites to external components. Examples of types of connection sites that can be used in this invention are: land grid arrays, surface mount pads, and ball grid arrays. Land grid arrays comprise multiple plated pads to which the external component is attached.

Examples of such external components include integrated circuit chip carriers, modules, and the like. Physical connection can be made in various ways, including soldering, or by direct physical contact through connectors from the external components. Such external connectors typically have a mechanism ensuring contact by means that create a positive holding force to the connection site on the printed wiring board. The attachment and removal of these external components can cause abrasion, wear, and deformation of the connection sites, especially when these external components are replaced multiple times. Therefore, having a surface on the connection site that is durable both chemically and physically is highly advantageous. Measuring the electrical resistance over a period of time tests the durability of such a connection site. It is desirable to find no increase in resistance.

As discussed supra, the inventive process begins with an organic dielectric substrate in the form of either a laminate or homogeneous film base. The substrate may contain through holes, blind holes, and additionally may be multilayered having embedded circuitry. The chemical composition of the dielectric substrate can be of various types, including, but not limited to: Driclad, FR4 BT, polyimide, and Teflon®. Preferred compositions include epoxy resins that provide excellent adhesion to subsequently coated metallic layers. Such compositions are commercially available and are known in the art as laminate resin systems.

Prior to applying the metallic layer, the dielectric substrate may need to be pretreated to assure sufficient adhesion to the metal layer to be laminated to its surface. Known processes, such as seeding with a noble metal like palladium, can be employed. Other methods that chemically or physically etch the dielectric substrate surface are also useful in this invention. The dielectric substrate is then plated with a metal that ultimately will provide the circuitry and features of the manufactured printing board. The plating of the dielectric substrate can be provided by any of the known methods of plating, such as sputtering, electroless plating, or electrolytic plating. Plating thickness can range from, but is not limited to, approximately 8 microns to 80 microns. Preferred thickness ranges from approximately 12 microns to 37 microns.

Typically, the chemical composition of the plating material is a conductive metal. Examples include: copper, and its alloys, aluminum and its alloys, nickel and its alloys, and other conductive metals. The uniform metallic plating thus applied is then converted into the necessary features and fine line circuitry found on the finished printed wiring board. Conversion, sometimes known in the industry as personalization, typically is performed by photolithographic means employing a series of steps that include:

a) applying a photoresist to the metallic layer;

b) applying an opaque mask over the photoresist, the mask having discrete openings in the form of an image that will ultimately be transferred to the metallic layer;

c) exposing the mask to electromagnetic radiation or an electron beam so that such radiation only impinges on the photoresist in areas where openings in the mask are present;

d) removing the mask;

e) applying a developing solution to the photoresist to create a series of openings extending to the underlying metallic layer in areas where the photoresist has high solubility;

f) chemically etching the areas of uncovered metal to uncover dielectric substrate, thereby forming electrically discrete features and circuitry; and g) stripping the remaining portion of the photoresist from the upper surface of the latent features and circuitry.

The general description for this process is applicable to either a negative working or positive working photoresist system. In the case of a negative working photoresist, the areas of photoresist that will be etched are those unexposed to light. For positive working photoresists, the areas exposed to light will be more susceptible to etching. In either case, the present invention can generate the necessary features and fine line circuitry. Most preferred is the use of negative working photoresists either in dry film or liquid form. Examples of such materials include DuPont Riston and Morton Laminar.

Depending on the thickness of the initial metallic layer, the discrete features and circuitry can be formed by any of the processes known in the art, including subtractive, semiadditive, or additive. If the subtractive process is employed, the latent features and circuitry are actually formed during the metal etching process. If the additive or semiadditive process is employed, additional plating steps are required to generate the final form features and circuitry.

The process for plating can be any of the known methods including sputtering, electroless plating, and electrolytic plating. Most preferred in this process is electroless or electrolytic plating. The features and circuitry thus formed will have dimensions in keeping with requirements for high density printed wiring boards. For example, the heights of the features can be, but are not limited to, the range of approximately 8 microns to 80 microns. Preferred heights range from 12 microns to 37 microns. The spacing between the walls of adjacent conductor elements can range between approximately 12 microns and 2500 microns. The preferred range is between approximately 25 microns and 125 microns.

The next step in the process is to protect the fine line circuitry from the later plating steps of the features. Protection is achieved by employing a photoresist and a mask of the types previously described. In this case, the photoresist is etched in areas where the features are to be plated and cover the fine line circuitry. The features exposed are the intermediary stages of the connection sites for external components, e.g., land grid arrays. In one embodiment of this invention, the lithographic technique is eliminated when, for instance, the entire surface is to be subsequently plated.

As mentioned previously, a major object of the invention is to prepare the connection sites without electrolytic plating, thereby avoiding the need for a commoning layer. In this invention, it is also important to keep manufacturing steps and costs to a minimum. For these reasons, a minimum number of critical layers are coated and their thicknesses are optimized to assure optimal performance, i.e., excellent durability and excellent electrical connectivity, yet be as thin as possible for cost considerations.

The plating process of the present invention begins with the application of a diffusion or metal barrier layer to the metal features at the connection sites. The barrier layer metal features typically will be further processed into electrical connector sites such as land grid array sites. The barrier layer can be chemically composed of metals like cobalt or nickel and alloys therefrom. The thickness of the deposited layer can range from approximately 1.0 microns to 10.0 microns. A preferred range of thickness is from approximately 2.0 microns to 6.0 microns. A most preferred range of thickness is between approximately 2.5 microns and 5.0 microns.

The barrier metal can be applied either by electrolytic, electroless, immersion plating, or sputtering techniques. The preferred method of application is electroless plating. Electroless plating produces essentially non-crystalline metal platings. For example, if nickel is used, it will be amorphous as seen by X-ray diffraction analysis. However, within the scope of this invention crystalline nickel is also exclusively contemplated as is polycrystalline nickel (i.e., multiple islands of crystalline phase within a sea of amorphous phase), to provide a surface hardness of 230 Knoop.

In one embodiment of the invention, the barrier layer is applied conformally to the conductive metal feature. Conformal application is defined as complete coverage of the exposed surfaces of the conductive metal feature (i.e., uppermost and sidewall surfaces). In another embodiment of the invention, the barrier layer is applied in a non-conformal fashion exclusively to the upper surface of the conductive metal feature. If this embodiment is practiced, then at least one of the subsequently applied precious metal layers must be conformally applied to the conductive feature.

In yet another embodiment of the invention the barrier layer application step is eliminated and subsequent layers are plated directly onto the conductive metal feature. Elimination of this step will yield satisfactory results if miminal diffusion of the conductive metal feature into the upper precious metal layers is observed, or if the consequences of such diffusion are not critical to the overall performance of the connector. As would be expected, the ability to eliminate the barrier layer is very dependent on which conductive metal and which precious metal are thereby brought into contact. Other factors that will impact the success of eliminating the barrier layer include the method of application of either layer and surface treatments that affect adhesion.

The next step after the diffusion or barrier layer is applied is application of a first precious metal. Typical precious metals used in this invention include platinum and palladium. The preferred precious metal is palladium, which has a surface hardness of 260 to 300 Knoop. Both palladium and platinum offer a plated layer that will have a high degree of hardness, thus providing the resultant connective site with excellent durability. The palladium can be applied by electroless, electrolytic, or immersion plating, or by sputtering. Preferred methods of application are electroless or immersion plating.

It is known in the art that using reducing agents during the process of electroless plating will facilitate achieving desired thickness. Reducing agents used in this invention are: hypophosphite, hydrazine borohydrides, aminoboranes, thiourea dioxides, alkali metal borohydrides, and formaldehyde and derivatives thereof. Preferred materials include hypophosphite, aminoboranes, and formaldehyde derivatives. As can be seen from the list of reducing agents, the majority is derived from either boron or phosphorous containing materials. If these materials are used, the resultant precious metal layer may contain measurable quantities of these elements. Specifically contemplated in the present invention are reducing agents that leave de minimus or no residual quantities of reducing elements.

Whether combined with reducing elements or not, palladium is known to have properties such as gas adsorption that prevent its use as an outer layer in a connective site. Gas adsorption can lead to embrittlement, and can also catalyze other reactions that ultimately will weaken the connection between the printed wiring board and the external component. Plating thicknesses of the first precious metal range from approximately 0.04 microns to 0.5 microns. Preferred thicknesses range from approximately 0.06 microns to 0.3 microns. In one embodiment of the invention, palladium is initially applied electrolytically for pattern plate operation etch mask capability and then optionally overcoated electrolessly for conformal coverage.

In one embodiment, the first precious metal layer is applied conformally to the conductive metal feature. In another embodiment, the first precious metal layer is applied exclusively to the uppermost surface of the conductive metal feature.

The final plating step of the invention involves plating a second precious metal onto the outer surface of some portion of the first precious metal layer. This second precious metal layer serves as a passivation layer, chemically inertizing the outer surface of the electrical connector feature. The most preferred second precious metal for use in this invention is gold. The gold can be applied either electrolessly by immersion plating or sputtering. The electroless plating of gold is too soft (60 to 90 Knoop). Immersion plating can provide a hardness of 130 to 250 Knoop. Most preferred is immersion plating. The thickness of this second precious metal layer can be between approximately 0.01 microns and 0.30 microns. The preferred thickness range is between 0.05 microns and 0.1 microns.

It is known in the art that electroless plating (60 to 90 Knoop) provides a gold layer that does not have the hardness of electrolytic gold (130 to 250 Knoop), but this is compensated in the invention, by having the hard first precious metal layer of palladium, which has a hardness of 260 to 300 Knoop. The gold as applied in any of the inventive processes provides excellent chemically specific protection against corrosion.

In one preferred embodiment of the invention, the second precious metal layer is conformally applied to the overcoated conductive metal feature. In a second embodiment, the second precious metal layer is applied exclusively to the upper surface of conductive metal feature. This latter embodiment can only be performed if either the barrier layer or first precious metal layer is conformally applied to the conductive metal feature.

In another embodiment of the invention, the passivation layer is omitted entirely. This may impact the field life of the connective site but will not impact other critical features. As discussed supra, either the first or second precious metal coating layer must provide conformal coating of the sidewall features if extended connective site reliability is required.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A process for manufacturing a printed wiring board having a land grid array comprising the steps of:

a) providing a personalized printed wiring board comprising copper circuitry and copper pads disposed on at least one lateral surface of said printed wiring board said copper pads comprising upper and sidewall surfaces, said personalized wiring board being absent a commoning structure;

b) selectively covering said copper circuitry with a resist;

c) using a non-electrolytic process, plating nickel onto said copper pad upper and sidewall surfaces;

d) using a non-electrolytic process, plating a first precious metal onto said nickel;

e) using a non-electrolytic process, plating a second, soft precious metal onto said first precious metal; and f) removing said resist, wherein at least one of said plated materials conformally covers upper and sidewall surfaces of said copper pad.

2. The process of manufacturing a printed wiring board having a land grid array as recited in claim 1, wherein: said first precious metal comprises electroless or immersion plated palladium.

3. The process of manufacturing a printed wiring board having a land grid array as recited in claim 2, wherein said electroless or immersion plated palladium is plated on said nickel layer only in areas above said upper surface of copper pads and said second precious metal is electrolessly plated on said electroless or immersion plated palladium and on said nickel-plated layer disposed on said copper pad sidewalls.

4. The process of manufacturing a printed wiring board having a land grid array as recited in claim 3, wherein said second, soft precious metal comprises electroless or immersion plated gold.

5. A process for manufacturing a printed wiring board having a land grid array comprising the steps of:

a) providing a personalized printed wiring board comprising copper circuitry and copper pads disposed on at least one lateral surface of said printed wiring board said copper pads comprising upper and sidewall surfaces, said personalized wiring board being absent a commoning structure;

b) selectively covering said copper circuitry with a resist;

c) plating nickel onto said copper pad upper and sidewall surfaces;

d) plating a first precious metal onto said nickel;

e) plating a second precious metal comprising soft gold onto said first precious metal; and f) removing said resist, wherein at least one of said plated materials conformally covers said upper and sidewall surfaces of said copper pad.

* * * * *